United States Patent [19]

Bolda et al.

[11] Patent Number: 4,689,608
[45] Date of Patent: Aug. 25, 1987

[54] MAGNETICALLY SNAP ACTUATED CONTACT KEYBOARD APPARATUS

[75] Inventors: Frank J. Bolda; John P. McKnight; Russell J. Sturm, all of Raleigh, N.C.

[73] Assignee: International Business Machines Corporation, Armonk, N.Y.

[21] Appl. No.: 693,638

[22] Filed: Jan. 22, 1985

[51] Int. Cl.⁴ .............................................. G08C 9/00
[52] U.S. Cl. ........................... 340/365 L; 340/365 R; 200/5 A
[58] Field of Search ...................... 340/365 L, 365 R, ; 200/5 A, 159, 340, 159 A, 159 B

[56] References Cited

U.S. PATENT DOCUMENTS 4,341,934  7/1982  Muller ................................. 200/5 A
4,529,849  7/1985  Kamei et al. ........................ 200/5 A

FOREIGN PATENT DOCUMENTS 1046223  7/1963  United Kingdom ................ 200/340
2029105  3/1980  United Kingdom ............... 200/5 A

OTHER PUBLICATIONS

"Spring and Magnet Keyboard Actuator" by K. A. Lennon, IBM Technical Disclosure Bulletin, vol. 24, No. 8, Jan. 1982, pp. 4314–4315.
"Push Button Switch" by G. L. Spahn of Western Electric, Technical Digest, No. 53, Jan. 1979, pp. 23–24.
"Braille Readout Pocket Calculator" by R. A. Bartels, IBM Technical Bulletin, vol. 17, No. 8, Jan. 1975, pp. 2471–2472.
"Magnetic Snap-Acturation Keyboards" by Bolda et al, IBM Technical Bulletin, vol. 26, No. 6, Nov. 1983.

Primary Examiner—John W. Caldwell, Sr.
Assistant Examiner—Tyrone Queen
Attorney, Agent, or Firm—Edward H. Duffield

[57] ABSTRACT

In the preferred embodiment of the invention, the snap actuator is an angled magnetically permeable plate. One leg of the angled plate is attracted to a strip magnet placed on a circuitboard. This particular portion of the plate also has two spring fingers that make contact with spherical or domed contacts on the circuitboard or, in the alternative, have formed dome portions in the end of each finger for contacting flat contacts on the circuitboard so that a wiping action that is resistant to contamination results. The other leg of the angled plate serves as a lever arm to which key button pressure is applied. The angle between the plates or the edge of the strip magnet serves as a fulcrum for pivoting the plate under the influence of key pressure. When key pressure has built up sufficiently, the magnetic attraction is substantially broken and the angled plate is suddenly released, thereby breaking contact with the circuit contacts and allowing the circuit voltage to be sensed.

3 Claims, 16 Drawing Figures

MAGNETICALLY SNAP ACTUATED CONTACT KEYBOARD APPARATUS

FIELD OF THE INVENTION

This invention relates to keyboards for alphanumeric and data entry applications in general and specifically to magnetically detented snap actuators with improved resistive contact actuating structures.

PRIOR ART

Magnetic snap actuation keyboards are widely known since the breakaway characteristic of magnetically detented devices has often been exploited in patent literature to provide the sudden snap actuation that is desirable for keyboard applications. The designs have been of two general sorts: either an actuator plate is broken free from a fixed magnet or a movable magnet is broken free from a fixed plate. Such a design that has some similarities to the present invention was published in the IBM Technical Disclosure Bulletin, Vol. 26, No. 6, November, 1983, pages 2888–2890. However, these actuators did not have individual contact fingers, a wiping action contact, simplified keyboard structure or a high voltage open collector easily sensed output.

In addition, prior art magnetically actuated or detented keyboards have usually involved numerous separate pieces in the form of individual magnets, individual assembly steps to carefully position magnets for each key position, complicated wiring or contact structures that are separate from the actuator itself and other numerous cost and complexity increasing aspects that are less desirable.

OBJECTS OF THE INVENTION

In view of the foregoing shortcomings in the known prior art, it is an object of the present invention to provide an improved magnetically detented keyboard structure with a minimum of assembly parts and a maximum of shared function structure in which numerous functions are performed by the same element or elements.

Yet another object of the present invention is to provide an improved magnetically detented keyboard in which easily mass produced and simplified assembly elements can be utilized.

SUMMARY

The foregoing and still other objects of the present invention that have not been specifically enumerated are met in a preferred embodiment as described herein. In the preferred embodiment of the invention, the snap actuator is an angled magnetically permeable plate. One leg of the angled plate is attracted to a strip magnet placed on a circuitboard. This particular portion of the plate also has two spring fingers that make contact with spherical or domed contacts on the circuitboard or, in the alternative, have formed dome portions in the end of each finger for contacting flat contacts on the circuitboard so that a wiping action that is resistant to contamination results. The other leg of the angled plate serves as a lever arm to which key button pressure is applied. The angle between the plates or the edge of the strip magnet serves as a fulcrum for pivoting the plate under the influence of key pressure. When key pressure has built up sufficiently, the magnetic attraction is substantially broken and the angled plate is suddenly released, thereby breaking contact with the circuit contacts and allowing the circuit voltage to be sensed. During unactuated times, the actuator plate is contacting the contacts, electrically shorting them together, and one of the contacts is connected to ground potential so that no output is present. All of the contacts and interconnecting circuitry can be formed using printed circuit techniques on a circuitboard and the magnets can be in the form of plastic compound strip magnets which are later laid down on top of the circuitboard. The individual actuator plates can be easily positioned over locator posts rising up from a baseplate at regular interval spacings and the posts can also be used for registering the position of the printed circuit so that the individual actuators registered on their posts are also precisely positioned for the circuitry on the circuitboard. A flap of material may be die cut or slit and formed out of a portion of the actuator plate that is in contact with the magnet and this can act as a stop for limiting the amount of the excursion that the moving plate experiences in response to downward pressure on the actuating lever portion of the angled plate.

The invention will be described with reference to preferred embodiments thereof as more fully depicted and explained with reference to the drawing in which:

DETAILED SPECIFICATION

Figure 1A:
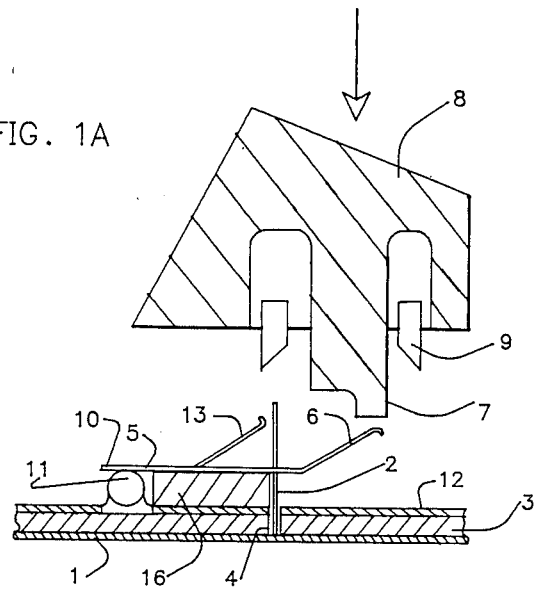
FIG. 1A illustrates a horizontal cross section schematic through a single magnetically detented key actuator position of a preferred embodiment of the invention.
Figure 1B:
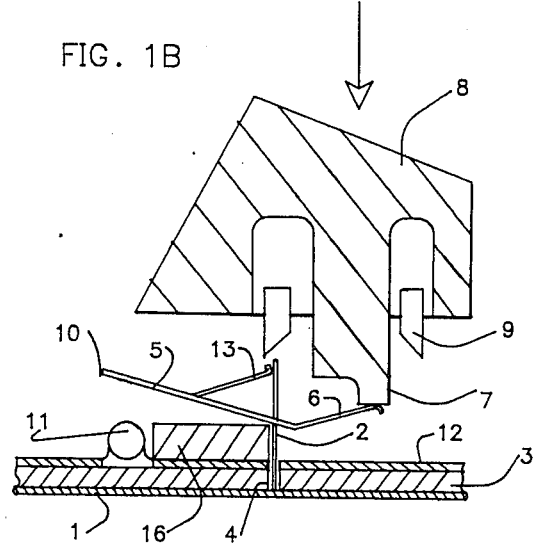
FIG. 1B illustrates a horizontal schematic cross section of the apparatus depicted in FIG. 1A in the actuated condition.

Turning to FIGS. 1A and 1B, a schematic enlarged cross section of a first preferred embodiment of the invention in the at rest and in the actuated condition, respectively, are illustrated. In FIG. 1A, the positioning or baseplate 1 may be formed of plastic or steel or other material as desired. Steel offers the advantage of electromagnetic radiation shielding, electrical grounding possibilities and high structural integrity but molded and/or plated plastics can offer much the same with the exception of the same high physical strength. A number of individual locator posts 2 of which one appears in FIG. 1A may be formed integrally with the baseplate 1, by slitting and stamping in the case of a steel or metallic plate or by molding in the case of plastic. The posts 2 would be spaced at regular intervals correlated with the desired keybutton spacings and positions in the assembled keyboard.

A circuitboard 3 of insulating material such as an epoxy laminate, sheet polyamide or the like may be employed. An aperture 4 in the circuit card 3 facilitates registering the circuit card precisely over the locator posts 2 on the baseplate 1. Circuitry 12 in the desired artwork pattern may be formed using well known techniques on the surface of the circuitboard 3. A contact ball which may be spherical as shown as ball 11 or hemispherical or any other generally dome shape may be attached to the circuitry 12 as a contact. Two of these contacts are utilized for each key actuator position, but only one is shown in FIG. 1A since the other contact ball for the key position illustrated would lie directly in back of the plane of the paper.

A snap actuator 5 in the form of an angled thin spring steel plate comprising arms 10, a body 5 and an extension or lever arm leg 6 is illustrated in cross section. A tongue or tab 13 is slitted and formed in the body 5 to serve as a stop against post 2 when actuator 5 is moved as shown in FIG. 1B.

Key stem 7 is arranged to slide in a housing 9 which may form a part of the top frame so that when pressure is applied to the key top 8, stem 7 will contact the lever arm or plate 6 that forms a portion of the actuator plate 5. A permanent magnet 16 is placed on top of the circuitboard 3 and may overlie the circuitry 12 as shown. The plastic may be a molded plastic permanent magnet material well known in the industry as flexible plastic strip magnets and it may be adhesively applied to lie in an elongated strip adjoining the contact balls 11 and the locator posts 2 as shown in FIG. 1A. By magnetic attraction, the magnet 16 will attract the actuator plate 5 which must be made of a ferromagnetic steel or stainless steel or some other magnetically permeable material. Magnetic type stainless steel is preferred since it resists corrosion and contamination better than ordinary steels.

Contact between the ends 10 of the spring steel actuator plates 5 and the individual contact balls 11 comprising each key location occur when the plate 5 is attracted to the magnet 16 as shown. Because of the spherical nature of the contact 11 bearing against the flattened contact finger 10 which is integrally formed in the end of the magnetic actuator plate 5, high contamination resistance is achieved. In addition, due to the break away characteristic of the magnet and the flexibility of the actuator plate 5, a slight wiping action occurs between the contact portion 10 of the plate 5 and the fixed hemispherical contact 11 on the circuitboard 3. This provides a cleaning action well known in the art.

FIG. 1B illustrates the elements of FIG. 1A when the key top 8 has been fully depressed to the point that break away of the actuator plate 5 from magnets 16 has occurred and the stop post 13 has been brought into abuttment with the locator post 2. Continued downward pressure on key button 8 will flex leg 6 providing the necessary overtravel so desirable in key mechanisms. Eventually, the leg 6 will contact the top of the circuitboard and a high resistance to increased deflection will immediately result.

A logic level high voltage such a 5-volt DC is supplied to all of the key positions in a keyboard so that for each key position such as illustrated in FIG. 1A, one of the contact balls 11 is supplied with 5-volt potential. The other ball 11 is connected to ground and interconnection between the two balls at each key location is via the actuator plate 5 with its integral contact spring fingers 10. Thus, when the actuator is in the actuated position such as shown in FIG. 1B, shorting between the two contact balls 11 is interrupted and the high voltage potential of 5 volts may be scanned by a scanner as will be described later and found to be present at the specific key location which has been actuated.

As is apparent from FIGS. 1A and 1B, when sufficient force has been applied to the key top 8 and transmitted to the actuating lever arm 6 of the actuating plate 5, the magnetic attraction to plate 5 will be broken and the actuator plate will snap to a stop condition where stop post 13 contacts locating post 2. Additional deflection of the arm 6 is also possible as has been previously described.

Figure 2A:
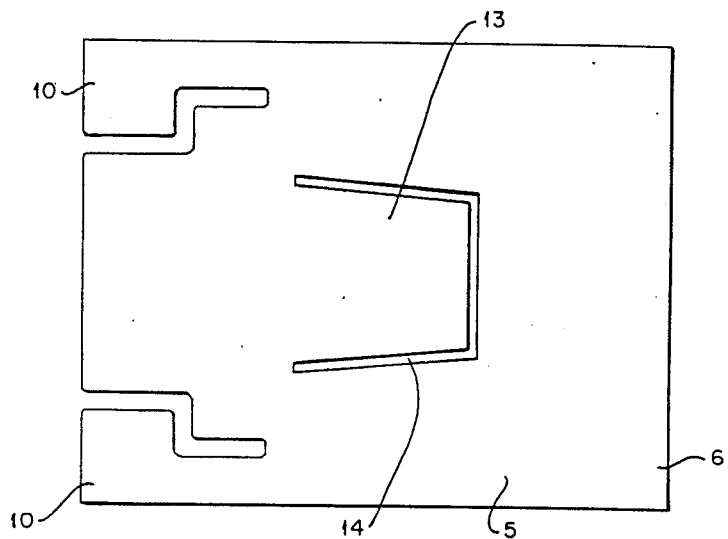
FIG. 2A illustrates a plan view of an individual angled plate actuator.
Figure 2B:
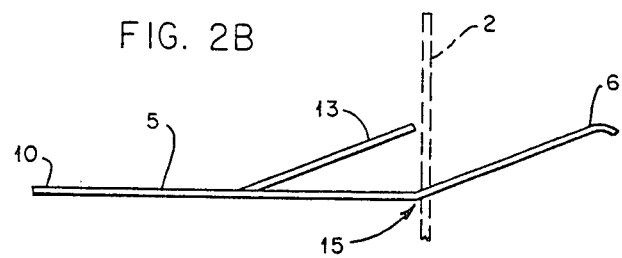
FIG. 2B illustrates a side elevation of the angled actuator in FIG. 2A.

Turn to FIG. 2A, a plan view of an individual actuator plate 5 is shown. It may be seen that the plate is actually one integral piece of material that has been formed by stamping or slitting or chemical machining or other operation of similar sort. A slit 14 frees a tongue or tab portion 13 to be bent upward at an angle from the main body 5 to serve as the stop post as shown in FIGS. 1A, 1B and 2B. Individual contact spring fingers 10 are formed in the end of the actuator plate 5 as illustrated and the lever arm 6 is formed by bending the plate 5 as shown in FIG. 2B.

As will be easily understood by those of skill in the art, a total assembly of key positions in a typical keyboard may be easily manufactured utilizing the structure as shown in FIGS. 1A and 1B for the preferred embodiment. First a baseplate 1 is formed with appropriate locating posts 2. Then a circuitboard with die cut apertures corresponding to the spacing of the locating posts and the baseplate 1 is positioned on top of the baseplate and the magnets 16 are laid in place over the top of the circuitboard. Then, individual actuators 5 are positioned over the locator posts 2 which protrude through the individual slots 14 in each actuator 5. This precisely locates the actuator plates 5 so that the spring fingers 10 will align with the contact balls 11 at each key position. Then a keyboard frame top 9 containing numerous key buttons can be placed over the entire structure and assembly is complete. An even more simplified embodiment is illustrated in FIG. 3A through 3C.

Figure 3A:
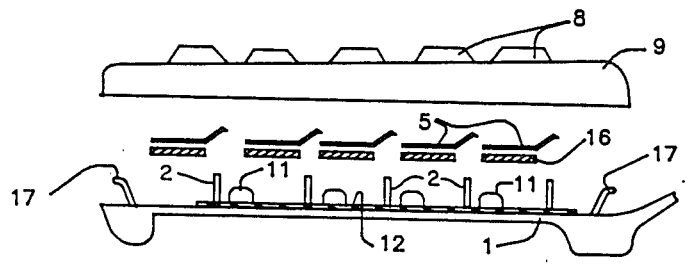
FIG. 3A illustrates schematically an exploded horizontal view of the various elements in the simplified structure of a second preferred embodiment of the invention.

FIG. 3A illustrates a schematic horizontal exploded section of a second preferred embodiment of the invention. In FIG. 3A, the base plate 1 is made of molded plastic material that can be sensitized and have plated directly on it the entire circuit pattern and contacts 11 and 12. Individual strip magnet 16 can then be laid down adjacent the locator posts 2 and the actuator plates 5 put in position as previously disclosed. The overall unitary top cover and frame 9 with individual key actuator buttons 8 can then be dropped in place and located over locating and snap fit posts 17 to complete the assembly.

Figure 3B:
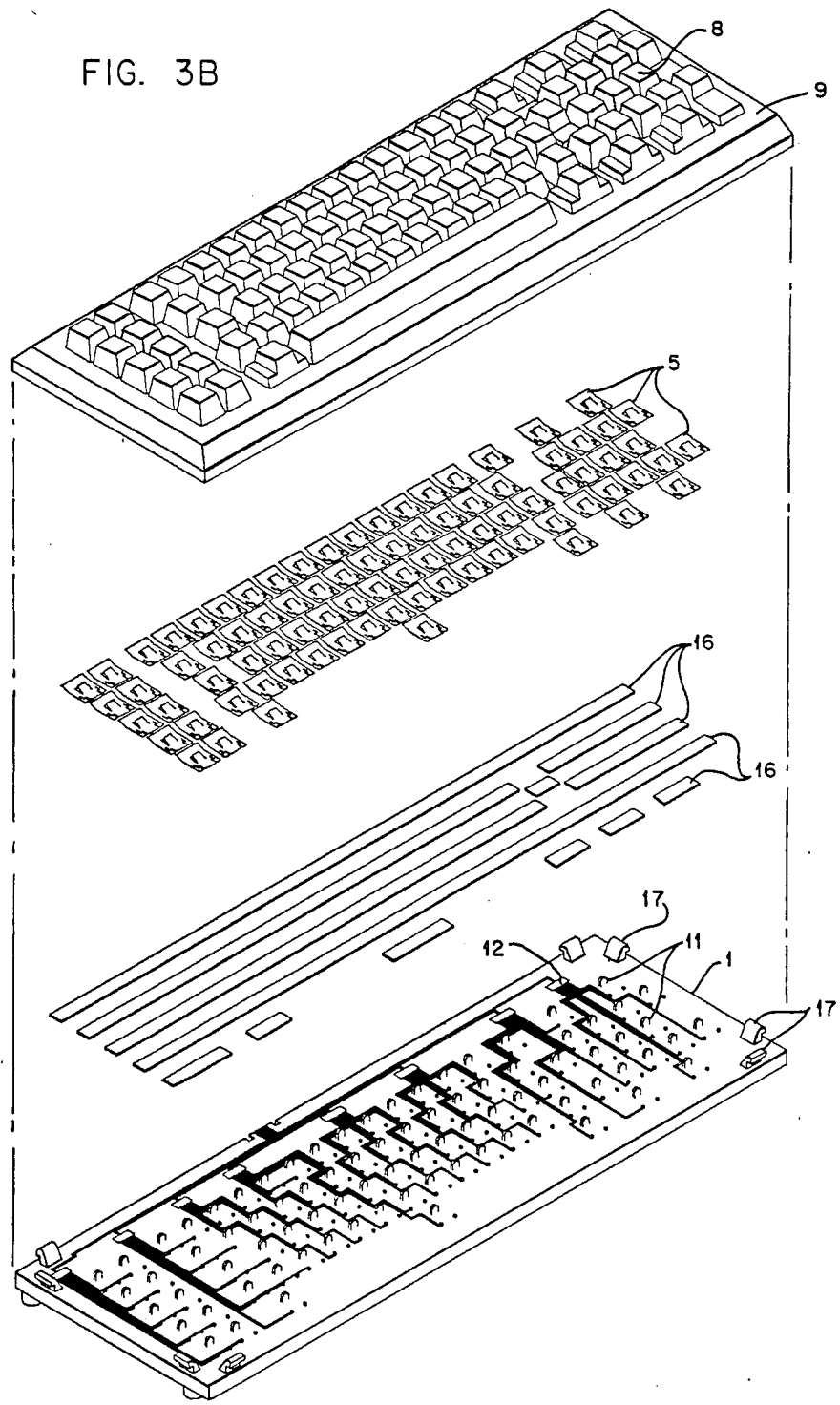
FIG. 3B illustrates in greater detail the layered assembly approach for the preferred embodiment illustrated in FIG. 3A.

FIG. 3B illustrates pictorially the assembly steps and dramatically illustrates the simplicity of structure and manufacturing steps involved for this embodiment. It will be observed that the baseplate 1 is actually the lower housing of the overall keyboard and has integrally molded with it the contacts 11, the locating posts 2, and the circuitry 12 interconnecting the various contacts as necessary. The form of the individual strip magnets is shown and the individual actuator plates 5 in a typical key button array are also shown. The upper housing and frame portion 9 holds the individual keytops 8 as depicted.

Figure 3C:
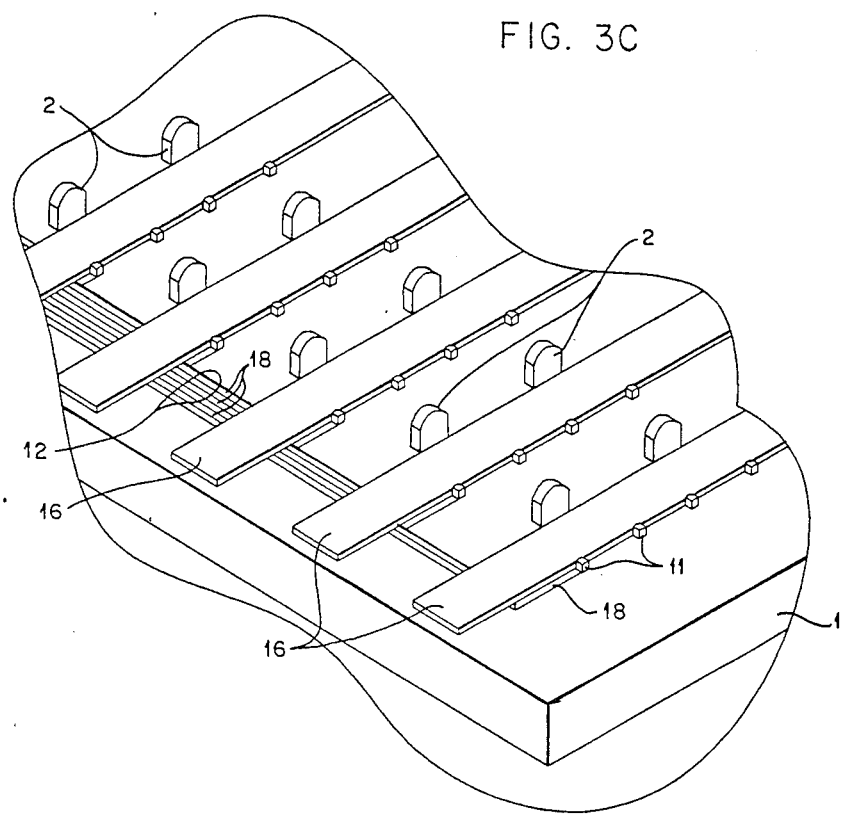
FIG. 3C illustrates an enlarged schematic view of a portion of the assembly that results in the embodiment of FIGS. 3A and 3B.

FIG. 3C illustrates an enlarged partial pictorial view of a section of the assembled structure from FIGS. 3A and 3B. It may be observed that the individual locator posts 2 serve the purpose of providing a registration point for registering the magnet 16 as well as providing the location points for the individual actuators 5 (not shown in FIG. 3C). The individual circuit lines 18 making up the printed circuit 12 are plated directly in place on the base plate or frame 1 as are the individual contacts 11 associated with each key position. Only one contact at each key position is supplied with a conductor 18, the other contact 11 being connected to ground through a common connection to the base of frame 1 (not shown).

Figure 4:
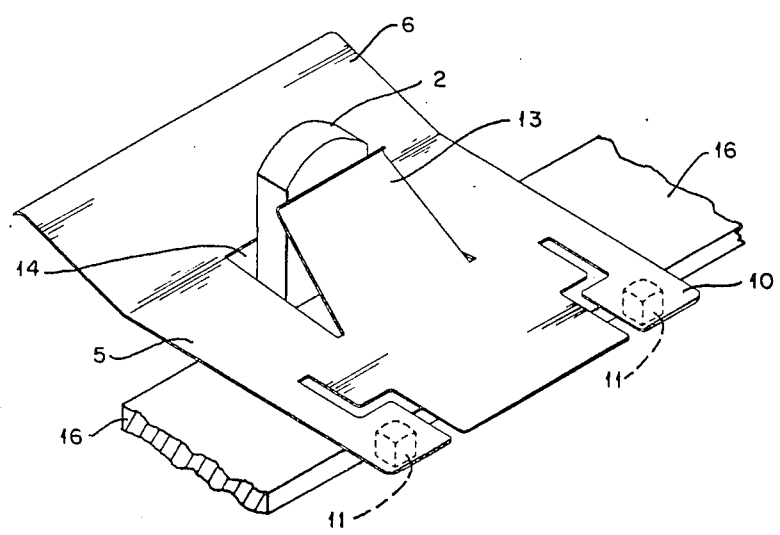
FIG. 4 illustrates a single key actuator position in enlarged form.

Turning to FIG. 4, an enlarged pictorial view of one assembled actuator plate 5 in position over a locator post 2 and having spring finger contacts 10 engaging the contacts 11 when the plate 5 is attracted to magnet 16 is illustrated.

Figure 5A:
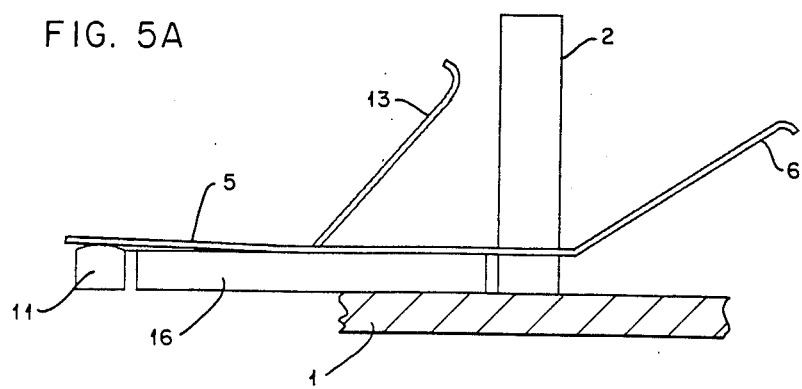
FIG. 5A illustrates an enlarged horizontal schematic of a single key actuator mechanism in the unactuated position.
Figure 5B:
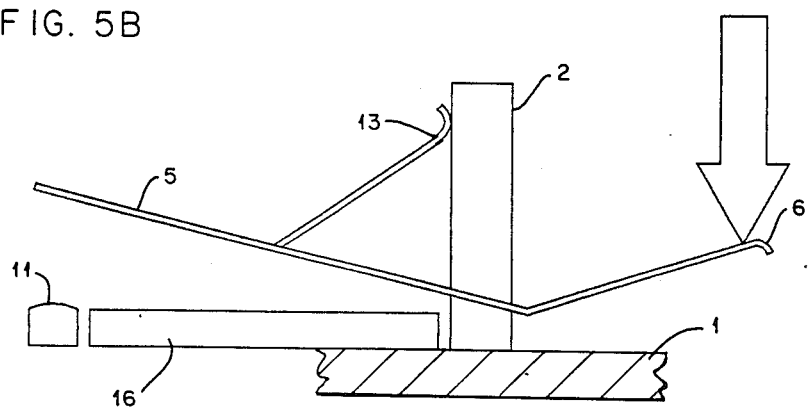
FIG. 5B illustrates the same mechanism as FIG. 5A but in the actuated position.

FIGS. 5A and 5B illustrate diagramatically the structure as shown in FIG. 4 in two stages of actuation. In FIG. 5A, the actuator is in its rest position and spring finger contacts 10 are in electrical and physical contact with the individual contacts 11 that are connected as previously described to the circuitry 12, not shown. The actuator plate 5 is attracted by magnet 16 and the stop post 13, preferably bent upward at an angle of approximately 55°, is out of contact with the locator post 2. The angled upward lever arm 6 which is an integral part of the actuator plate 5 may be supported at its fulcrum point as shown or may be fulcrummed on the post 2.

In FIG. 5B, a downward force has been applied to leg 6 and contact between the contacts 10 and 11 has been interrupted since force applied to leg 6 has been depicted as great enough to have caused breakaway to have occurred between the magnet 16 and the actuator plate 5. Magnetic adhesion always exists between the angled plate and the fulcrum. This allows the mechanism to function when completely inverted. The magnetic attraction dampens bounce to the point of virtual non-existence. Also, the keyboard is significantly less susceptible to vibration The stop post 13 is in position against the locator post 2 and further deflection of leg 6 is possible to provide an overtravel feel that is desirable in the art.

As is evident from the discussion so far, beam spring or spring finger actuators of the type depicted in the figures can be formed either with flat fingers 10 or with a dome portion in the end of each finger 10. If the end of the fingers 10 is formed into a hemispherical pad, the keyboard may be made with flat contact pads 11 on the circuitboard 3. While this has not been illustrated, its variation will be apparent to those of skill in the art. The hemispherical contact on the circuitboard, which is the alternative illustrated in the figures, has some desirable attributes beyond that of a flat contact 11 in that actual contact point is elevated above the substrate of the frame or circuitboard so that any contamination in the form of dust, dirt, or liquid has a chance to run off from the actual contact points.

A wiping action is achieved during actuation by making the height of the actual contact point slightly greater than the thickness of a magnet 16. This causes a slight deflection in the spring finger ends 10 of the actuator 5 as depicted in the figures. Overall assembly is greatly simplified since the base plate or positioning plate 1 can have the locator post 2 integrally formed in it by stamping or molding. The steel actuators 5 can be located over the posts as can the circuitboard 3 and the actuators will be held in place by the magnet strip 16 so that the unfinished assembly may be easily handled from station to station and have the entire top cover or frame 9 with individual buttons 8 and return springs (not shown) dropped in place. In the alternative, the spring lever arm 6 of individual actuator plates 5 may serve as the key button return spring.

When an individual key button 8 is depressed sufficiently, a force is exerted on the actuator plate 5 sufficient to cause breakaway from the magnet 16 which interrupts the circuit that has been completed between the contacts 11 via the integral spring contact fingers 10 in plate 5. This will be registered in a scanning microprocessor as will be described briefly below. The operator pushing key button 8 experiences a touch sense of instantaneous snap action that is very desirable for keyboard applications. The actuator plate 5 actually lifts off of magnet 16 initially and is followed by the spring fingers 10 which forms a wiping action on lift-off that is repeated in reverse upon closure of the contacts. The self-wiping feature results in high reliability contacts as will be appreciated by those of skill in the art. In addition, the magnetic attractive forces between the actuator plates 5 and the magnetic strip 16 greatly reduce contact bounce upon closure. The magnetic damping action upon release is also effective. The overall result is that the contacts are self-cleaning, wiping and have a high anti-tease function because of the sudden breakaway that is achieved in the irreversible fashion due to the stored energy of the spring arm 6.

The overall design is also suited to an overlay style of keyboard if the baseplate 1 is used actually as a top cover and the tabs or posts 2 are bend downward. Using this technique, with appropriate spacers and overlays, a nomenclature sheet can be placed over the ends 6 of the actuator plates 5 as is depicted in FIG. 7.

Figure 7:
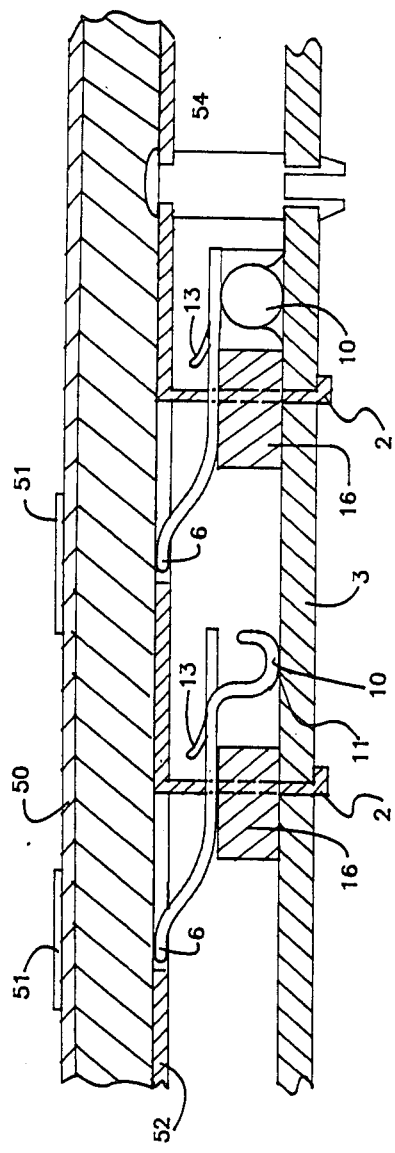
FIG. 7 illustrates an enlarged partial cross section in schematic form of a third preferred embodiment of the invention.

In FIG. 7, for example, an overlay sheet 50 with individual nomenclature 51 that can be supported on a top plate 52 having an aperture 53 aligned with the lever arm 6 of an actuator plate 5 attracted to a magnet 16 on a circuitboard 3 can be built. The contact arm 10 is shown of the formed spring finger type to make contact with a flat contact 11 on the circuitboard 3. A spacer post 54 keeps the top plate 52 at the desired spacing above the baseplate or circuitboard 3.

As will be apparent to those of skill in the art, the touch or sense of feel provided can be easily varied by varying the width of the actuator plates 5 that are in contact with the magnet 16. Alternatively, the size of the magnetic strip 16 can be modified to offer a menu of different key touch and sense options for an individual preferred result, i.e., high, medium or low force keyboard actuation. Alternatively, the contacts 10 and 11 can be made between the stop post 13 and the locator post 2 to form a normally opened switch structure instead of a normally closed one such as that illustrated in the foregoing figures.

The second preferred embodiment described above with relation to FIGS. 3A through 3C and FIG. 4 illustrates an embodiment in which the manufacture or assembly is made most convenient and the number of parts employed is greatly reduced as will be appreciated by those of skill in the art.

Figure 6A:
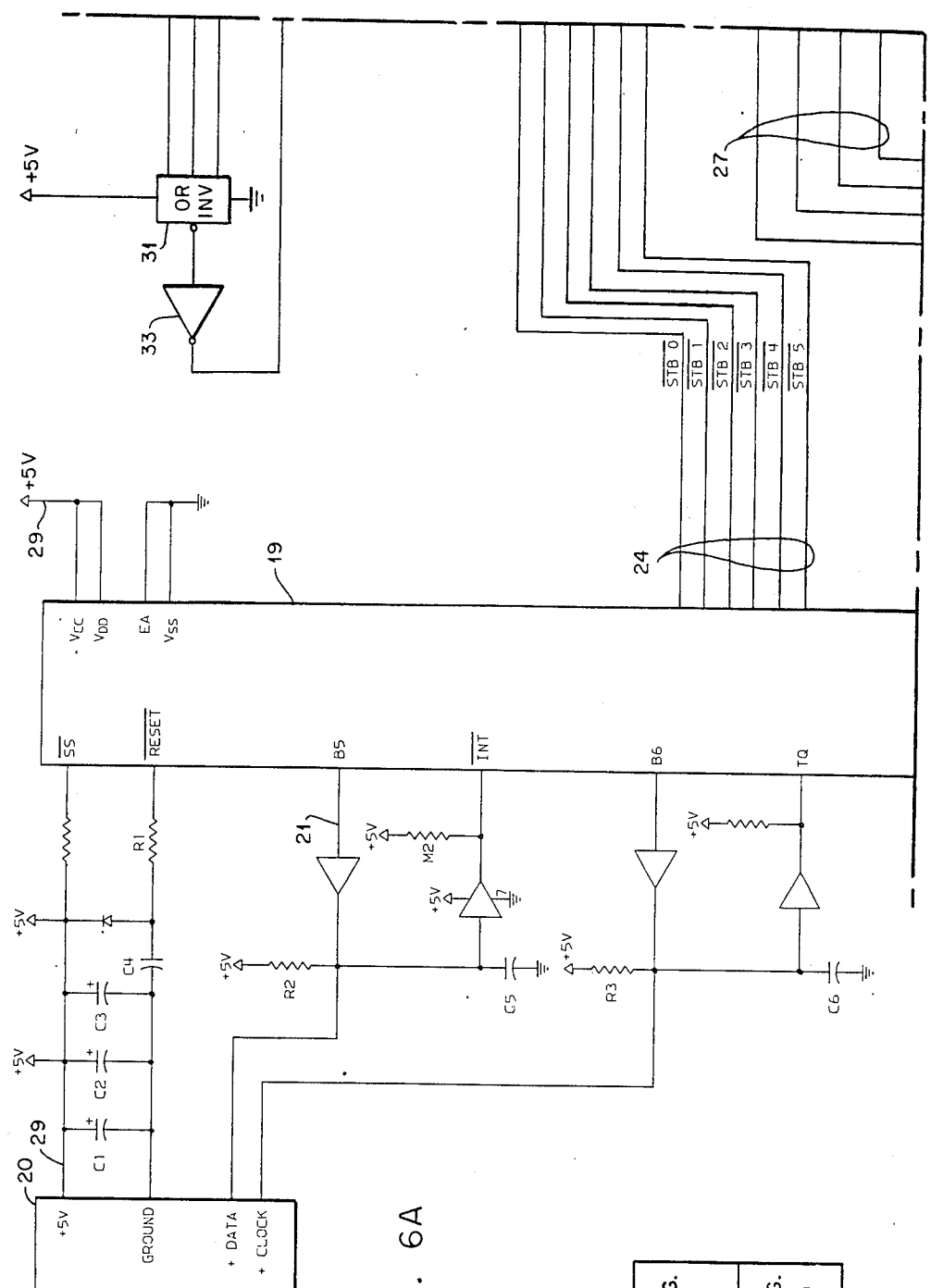
FIG. 6 illustrates an overall electrical schematic diagram of a microprocessor driven scanned keyboard system as a preferred embodiment of the invention.
Figure 6:
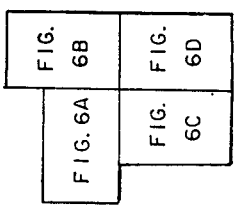
Figure 6B:
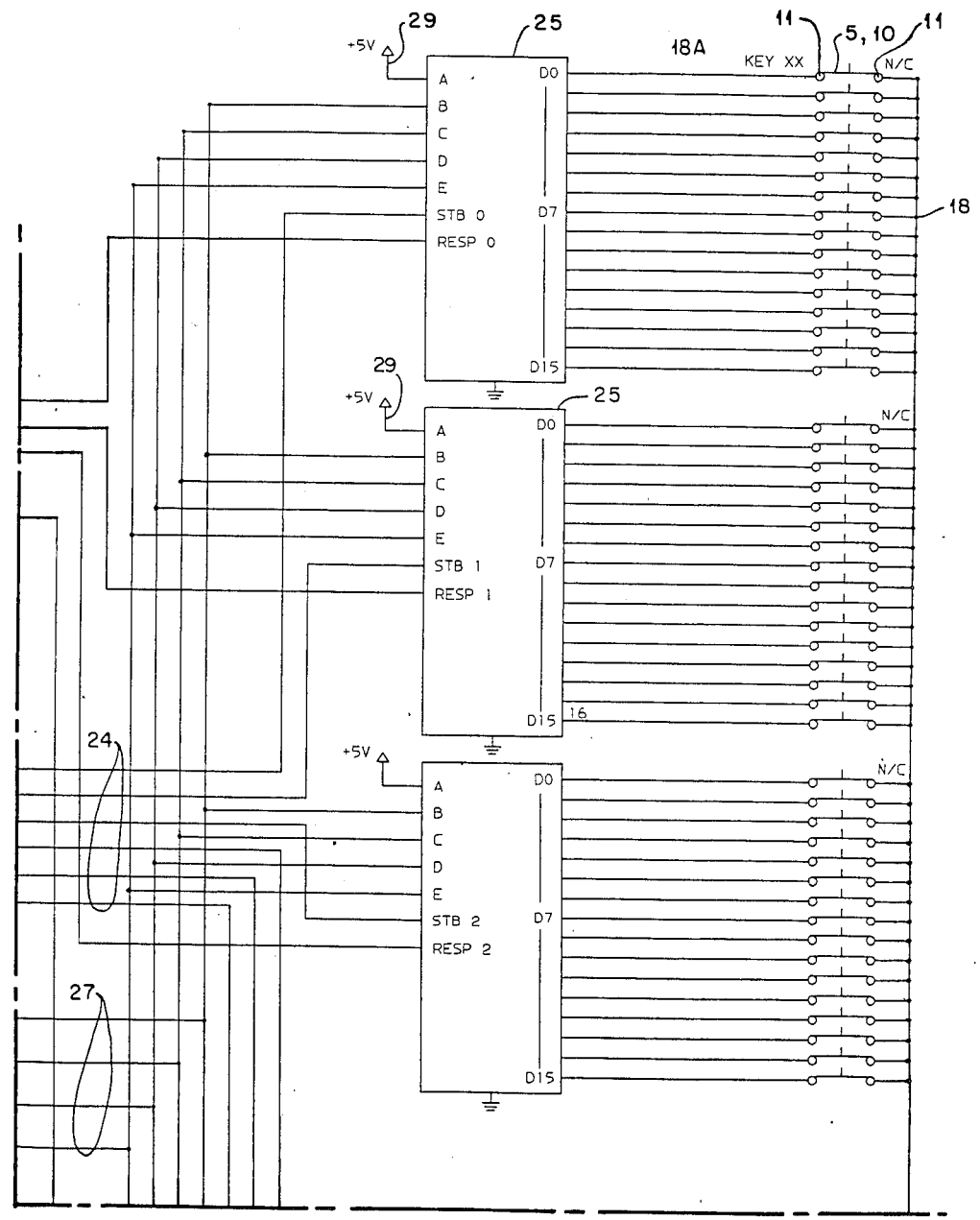
Figure 6C:
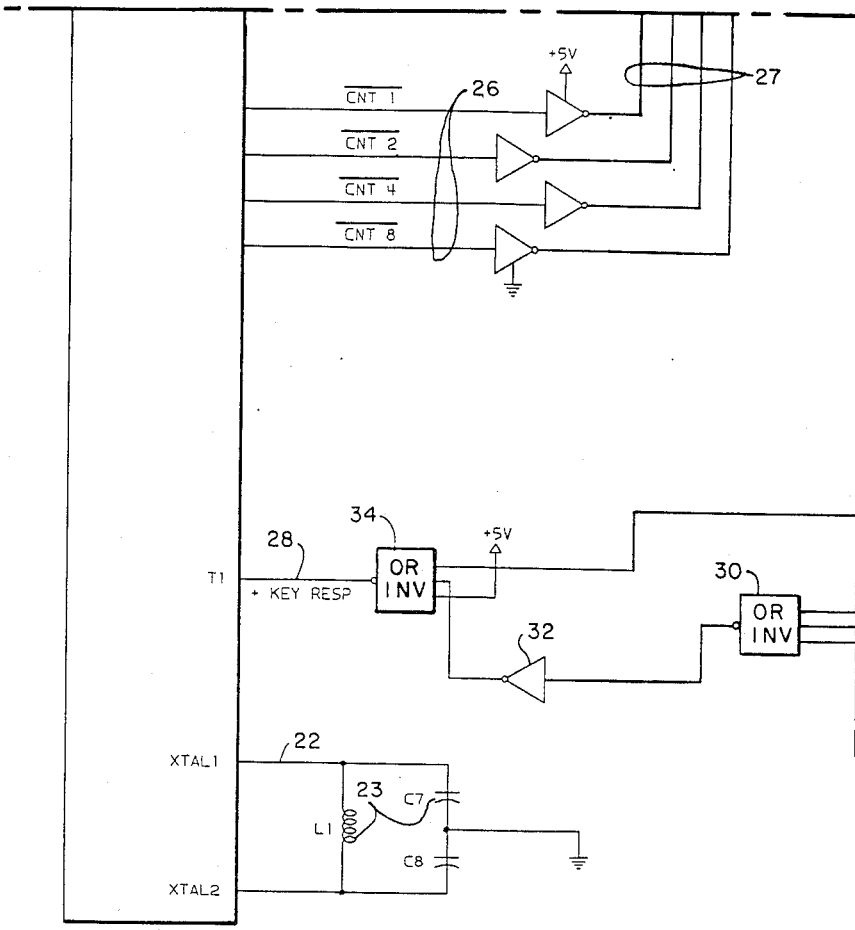
Figure 6D:
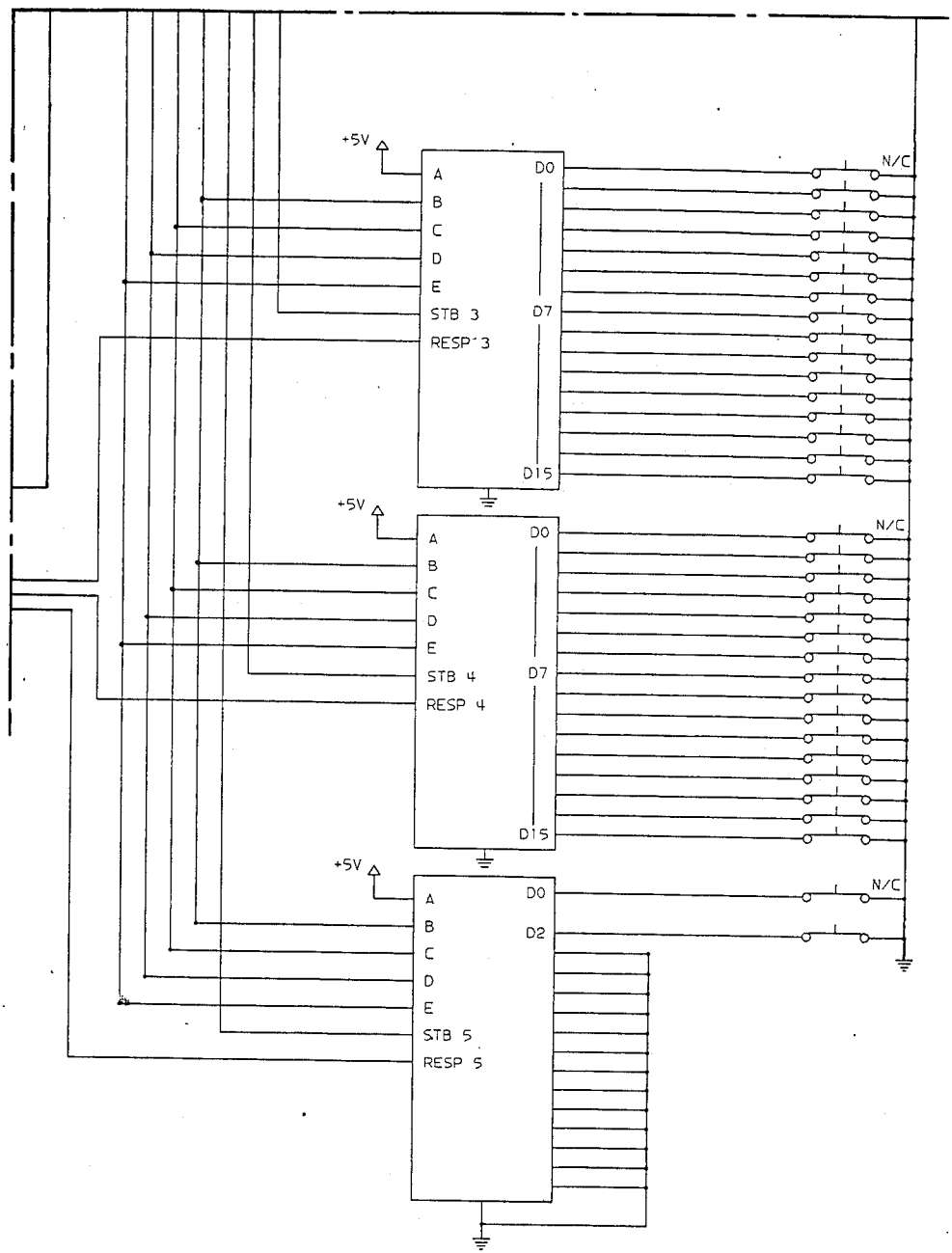

Turning now to FIG. 6, an overall electrical schematic generically applicable to any of the physical embodiments of the present invention is shown.

In FIG. 6, individual switch contacts 11 are schematically shown with normally closed switches comprising actuators 5 and spring fingers 10 as schematically illustrated. Individual ground conductors 18 are commonly connected together and to ground so that voltages applied on the supply lines 18A for each switch position will be shunted to ground through the normally closed switch contacts.

In the embodiment of the circuitry illustrated in FIG. 6, a control microprocessor 19 directs the overall scanning of the key locations in a manner well known in the art. The microprocessor may be, for example, an Intel type 8048 or its equivalent, many of which have been commercially available for a number of years. Similar microprocessor based keyboard scanners exist for both capacitive and resistive circuitry and are commercially available. Hence, no great detail is indulged in at this time and the overall embodiment will only be briefly described.

An interface plug 20 supplies 5-volt DC, an electrical ground and the data and clock input/output ports to the keyboard. The 5-volt DC potential is labeled 29 as it appears at numerous points within FIG. 6. The microprocessor 19 has an internal crystal oscillator that may be trimmed or regulated with the leads 22 connected to a tank oscillator circuit 23 as schematically depicted.

In operation, the microprocessor 19 steps continuously through a sequence of operations in which a specific drive code is applied on lines 24 to select one of the six illustrated 16 to 1 decoder selector chips 25. All that is required is that an individual port P10 through P15 be activated by the processor 19 to strobe an individual decoder selector chip 25 to determine whether any keys connected to its inputs have been actuated. The individual decoder selector chips may be the Texas Instrument type SN54150 16 to 1 data selectors multiplexors that are well known in the industry.

These chips are constructed in such a fashion that an input on any one of the 16 possible inputs will be gated to an output when the appropriate selection code is applied at ports A, B, C, and D.

The selection code is produced by the processor 19 as a key scan and sense code appearing at ports P20 through P23 and outputted on lines 26. Inverter amplifiers are connected in these lines to produce on lines 27 the select signals A, B, C and D that are applied in common to each of the six decoder selectors 25. However, only that specific decoder 25 that has its decode select on from one of the lines 24 will be active to decode the lines A, B, C and D. If a key has been depressed on a decoder that has been selected, and a match finally occurs between the A, B, C, D code produced by the key scan and sense output applied to the A, B, C, D inputs to the decoder selector chip 25 to which that key is connected, a 5-volt DC signal will be outputted to the OR inverter gates 31 or 30 to which the individual decoder selector chips 25 are connected. This level will be inverted in an inverter 32 or 33 and applied to a common OR gate 34 to supply an input on line 28 to the processor 19 indicating that an activated key has been found at the particular decoder 25 selected at this time by one of the lines 24 and at a key location identified by the key sense code A, B, C, D appearing on lines 26. The processor 19 can then output the appropriate data from a stored memory table associated with the given key that has been found to be actuated and this data appears on line 21 at the output from the processor 19.

Having thus described our invention with reference to several preferred embodiments thereof, it will be apparent to those of skill in the art that numerous departures from the specific construction shown can be made without departing from the spirit of the invention. Therefore, what is desired to be protected by Letters Patent and what is claimed in the claims are intended by way of description only and not by way of limitation. Wherefor, what is claimed is:

We claim:

1. An improved magnetically detented key actuator, comprising:
    a circuitboard having at least two physically separate contacts;
    at least one permanent magnet means adjacent to said contacts and laterally spaced from them;
    at least one actuator plate of magnetically permeable electrically conductive material positioned to lie in contact with and in magnetic attraction with said magnet means and having electrically conductive portions thereof in contact with said electrical contacts;
    said actuator plate having at least one angled lever arm extending laterally and upwardly therefrom and position to be depressed and provide a moment tending to separate said actuator from said magnet means and to separate said conductive portions of said actuator plate from said two physically separate contacts; and
    said electrically conductive portions of said actuator being integral spring contact fingers; and
    said magnet means tending to retain said actuator plate and said integral spring fingers thereof in contact with said magnet means as said angled lever arm is depressed, thereby causing a sliding, wiping action between said physically separate contacts and said integral spring contact fingers to occur until depression of said lever arm finally overcomes the magnetic attraction between said actuator plate and said magnet means in a sudden release that breaks electrical contact between said integral spring fingers and said physically separate contacts; and
    said actuator plate comprises a locating aperture for aligning said actuator so that said electrically conductive portions thereof align with said electrical contacts.

2. Keyboard apparatus comprising:
    a baseplate having a plurality of upstanding locator post means;
    a circuit board having a plurality of pairs of contacts thereon, a plurality of conductor lines thereon connected to said contacts and apertures therein to align said circuit board over said locator post;
    a plurality of permanent magnet means mounted on said circuit board adjacent to said pairs of electrical contacts; and
    a plurality of angled magnetically permeable electrically conductive actuator plates each of magnetically permeable electrically conductive material positioned to lie in contact with and magnetic attraction with a said magnet means and having electrically conductive portions; each of said electrically conductive portions thereof being in contact with one of said electrical contacts, said actuator plate having at least one angled lever arm extending laterally and upwardly therefrom and positioned to be depressed and to provide a moment tending to separate said actuator from said magnet means and to separate said conductive portions of said actuator plate from said physically separate contacts, and said electrically conductive portions of asid actuator being integral spring contact fingers; and said magnet means tending to retain said actuator and said integral spring fingers in contact with said magnet means as said angled lever arm is depressed, causing a sliding, wiping action between said physically separate contacts and said integral spring contact fingers until depression of said lever arm finally overcomes the magnetic attraction between said actuator plate and said magnet means in a sudden release that breaks electrical contact between said integral spring fingers and said physically separate contacts, said plates each having an aperture therein for placement over said locator posts and;

said plates being longitudinally divided into a plurality of fingers with at least two of said fingers being provided with electrical contact areas and each said area being aligned with a contact of one of a said pair of contacts on said circuitboard to eletrically connect said contacts together through said actuator plate.

3. Apparatus as described in claim 1 or claim 2, wherein:

said actuator plate comprises a stop means for limiting the movement of said actuator away from said magnet in response to said depression of said lever arm.

* * * * *